United States Patent
Yamamoto et al.

(10) Patent No.: US 6,217,996 B1
(45) Date of Patent: *Apr. 17, 2001

(54) AROMATIC POLYIMIDE FILM AND ITS COMPOSITE SHEET

(75) Inventors: Tomohiko Yamamoto; Takeshi Uekido; Toshiyuki Nishino; Hiroshi Inoue; Takuji Takahashi, all of Yamaguchi (JP)

(73) Assignee: Ube Industries, Ltd., Yamaguchi (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/259,436

(22) Filed: Mar. 1, 1999

(30) Foreign Application Priority Data

Feb. 27, 1998 (JP) .................................................. 10-046930

(51) Int. Cl.$^7$ ............................. B32B 15/08; C08G 73/10
(52) U.S. Cl. ...................... 428/220; 428/332; 428/334; 428/335; 428/336; 428/458; 428/473.5; 528/352; 528/487; 528/492
(58) Field of Search ................................. 428/219, 220, 428/334, 335, 336, 332, 458, 473.5; 528/352, 487, 492

(56) References Cited

U.S. PATENT DOCUMENTS 5,830,564  *  11/1998  Kohno et al. ........................ 428/220

* cited by examiner

*Primary Examiner*—D. S. Nakarani
(74) *Attorney, Agent, or Firm*—Reed Smith LLP

(57) ABSTRACT

An aromatic polyimide film composed of a biphenyltetracarboxylic acid unit and a phenylenediamine unit, and having a thickness of 5–150 μm and an elongation of 45–90% shows, in combination with an electroconductive film, improved mechanical characteristics, when it has the following tensile modulus and a tear resistance measured by Elmendorf tearing tester:

a tensile modulus of 750–1,300 kg/mm$^2$ and a tear resistance of 350–1,500 g/mm in the case that the thickness is 50 μm or less;

a tensile modulus of 650–1,200 kg/mm$^2$ and a tear resistance of 550–1,500 g/mm in the case that the thickness is 50–100 μm; and a tensile modulus of 550–1,100 kg/mm$^2$ and a tear resistance of 550–1,500 g/mm in the case that the thickness is 100 μm or more.

12 Claims, No Drawings

AROMATIC POLYIMIDE FILM AND ITS COMPOSITE SHEET

FIELD OF THE INVENTION

The present invention relates an aromatic polyimide film and a composite sheet comprising an aromatic polyimide film and an electroconductive film.

BACKGROUND OF THE INVENTION

Aromatic polyimide films show a high temperature resistance, a low temperature resistance, good chemical properties, high electrical insulating properties, and a high mechanical strength, and are widely employed in various technical fields. For instance, aromatic polyimide films are favorably employed as materials for manufacturing electronic devices. It is known that an aromatic polyimide film composed of a biphenyltetracarboxylic acid unit and a phenylenediamine unit particularly shows a high heat resistance and a high modulus of elasticity. In view of the high heat resistance and a high modulus of elasticity, the aromatic polyimide film composed of a biphenyltetracarboxylic acid unit and a phenylenediamine unit is particularly favorably employable for manufacturing a flexible printed circuit board (FPC), a carrier tape for tape-automated-bonding (TAB), and a tape of lead-on-chip (LOC) structure.

In the industrial fields of FPC, TAB and LOC, the aromatic polyimide film is employed in the form of a composite sheet in which the polyimide film and an electroconductive film (e.g., copper foil) are united with each other. The composite sheet is processed (e.g., cut or punched) while it is transferred in plural steps. In these procedures, the composite sheet using the conventional aromatic polyimide film sometimes shows tearing. Further, the conventional composite sheet sometimes shows compression buckling when it is punched.

It is known that the tearing and compression buckling of the composite sheet are closely related to a low elongation of the polyimide film. Also known is that a known aromatic polyimide film giving a high elongation shows a low modulus elasticity. Therefore, studies have been done for providing an aromatic polyimide film showing a high elongation as well as a high modulus elasticity.

Japanese Patent Provisional Publication (unexamined) No. 61-264027 describes a process for preparing a polyimide film having a good dimensional stability by producing a polyimide film from a biphenyltetracarboxylic dianhydride and p-phenylenediamine to obtain a polyimide film and heating thus obtained polyimide film while it is placed under application of a low tension.

Japanese Patent Publication (examined) H4-6213 describes that a polyimide film having a ratio of linear expansion coefficient (longitudinal direction/lateral direction) in the specific range, a linear expansion coefficient in the longitudinal direction in the specific range shows a good dimensional stability.

Japanese Patent Publications No. 62-60416, No. 63-5421, and No. 63-5422 disclose that an improved aromatic polyimide film is produced by modifying release characteristics of an aromatic polyamide acid film which is formed by casting an aromatic polyamide solution on a temporary support.

Japanese Patent Publication No. H3-20130 describes a polyimide film derived from 3 to 4 components such as a biphenyltetracarboxylic acid component, a pyromellitic acid component, a phenylendiamine and a diaminodiphenyl ether.

Japanese Patent Provisional Publications No. H4-198229 and No. H4-339835 describes a process in which a substituted or unsubstituted nitrogen-containing heterocyclic compound is employed.

According to studies of the present inventors, although the aromatic polyimide films prepared by these known processes show improvement of thermal properties such as linear expansion coefficient and dimensional stability as well as improvement of elastic modulus in tension, such polyimide films show poor elongation and tear resistance (measured by Elmendorf tearing tester), or show lowering of heat resistance.

Japanese Patent Provisional Publications No. H5-263049, No. H2-28257, and No. H6-334110 disclose an improved TAB tape, a polyimide film having improved flexing property, and a polyimide film having improved punching property, respectively. In these publications, polyimide films are prepared from a tetracarboxylic acid component comprising pyromellitic dianhydride and benzophenonetetracarboxylic dianhydride or biphenyltetracarboxylic dianhydride and a diamine component comprising a linear diamine (e.g., phenylenediamine) and a flexible diamine (e.g., diaminodiphenyl ether). The polyimide film improved in its flexing property is prepared by utilizing an organic phosphorus compound. The polyimide film shows a tearing resistance in the range of 20 to 70 kgf/20 mm.

The polyimide films disclosed in these publication, however, are still unsatisfactory in the elongation, tearing resistance (measured by Elmendorf tearing tester) or flexing property, or are low in the tensile strength or modulus elasticity in tension. Further, the disclosed polyimide films show poor adhesiveness.

Accordingly, it is an object of the present invention to provide an aromatic polyimide film which is easily punched with no compression buckling and transferred with no tearing in apparatuses for processing and/or punching the polyimide film and/or attaching various electronic parts onto the polyimide film.

It is another object of the invention to provide an aromatic polyimide film which is favorably employed for manufacturing FPC, TAB tape, or LOC tape.

SUMMARY OF THE INVENTION

The present invention resides in an aromatic polyimide film comprising a biphenyltetracarboxylic acid unit and a phenylenediamine unit, and having a thickness in the range of 5 to 150 $\mu$m and an elongation at break in the range of 45 to 90%, which has the following tensile modulus and a tear resistance (measured by Elmendorf tearing tester):

a tensile modulus of 750 to 1,300 kg/mm$^2$ and a tear resistance of 350 to 1,500 g/mm in the case that the thickness is not less than 5 $\mu$m and not more than 50 $\mu$m;

a tensile modulus of 650 to 1,200 kg/mm$^2$ and a tear resistance of 550 to 1,500 g/mm in the case that the thickness is not less than 50 $\mu$m and not more than 100 $\mu$m; and a tensile modulus of 550 to 1,100 kg/mm$^2$ and a tear resistance of 550 to 1,500 g/mm in the case that the thickness is not less than 100 $\mu$m and not more than 150 $\mu$m.

The aromatic polyimide film of the invention preferably has a thickness of 5 to 100 $\mu$m, a glass transition temperature of higher than 400°, a heat shrinkage of 0.002 to 0.4%, and/or a specific edge tearing resistance of 14 to 25 kg/20 mm/10 μm. The aromatic polyimide film of the invention preferably shows a dielectric breakdown voltage of not lower than 3 kV.

The aromatic polyimide film of the invention is preferably prepared from a polyamide acid which is produced by polymerization of 3,3',4,4'-biphenyltetracaroxylic dianhydride and p-phenylenediamine, and preferably contains 0.1 to 5 wt. % of an inorganic filler.

The aromatic polyimide film of the invention is preferably prepared by casting a polyamide solution to give a solution film and heating the solution film. More specifically, the aromatic polyimide film of the invention is preferably prepared by a process comprising heating a polyamide acid in the presence of an inorganic powder, an imidazole compound and an organic or inorganic phosphorus compound, said polyamide acid having been produced by reaction of a biphenyltetracarboxylic dianhydride or its derivative with a phenylene diamine.

The present invention also resides in a composite sheet comprising an electroconductive film and the aromatic polyimide film of the invention which are bonded to each other directly or via an adhesive layer.

In the composite sheet of the invention, the electroconductive film and the aromatic polyimide film are preferably bonded to each other via an adhesive layer comprising a thermoplastic or thermosetting adhesive. The adhesive layer preferably comprises an adhesive such as polyimide adhesive, a polyimide-epoxy resin adhesive, a polyimidesiloxane-epoxy resin adhesive, or an epoxy resin adhesive.

DETAILED DESCRIPTION OF THE INVENTION

In the preparation of an aromatic polyimide film, a biphenyltetracarboxylic acid component is employed. Examples of the biphenyltetracarboxylic acid components include 2,3,3',4'-biphenyltetracarboxylic acid and 3,3',4,4'-biphenyltetracarboxylic acid in the form of their free acid, halide, dianhydride or ester. Most preferred is 3,3',4,4'-biphenyltetracarboxylic dianhydride. The biphenyltetracarboxylic acid component can be employed in combination with other aromatic tetracarboxylic acid components (e.g., pyromellitic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane, bis(3,4-dicarboxyphenyl) ether dianhydride, bis(2,3-dicarboxyphenyl) ether dianhydride, 2,3,6,7-naphthalenetetracarboxylic dianhydride, 1,4,5,8-naphthalenetetracarboxylic dianhydride, 2,2-bis(3,4-dicarboxyphenyl)-1,1,1,3,3,3-hexafluoropropane dianhydride, and 2,2-bis(2,3-dicarboxyphenyl)-1,1,1,3,3,3-hexafluoropropane) in an amount smaller than that of the biphenyltetracarboxylic acid component.

The phenylenediamine employed in the invention may be o-phenylenediamine, m-phenylenediamine, or p-phenylenediamine. Preferred is p-phenylenediamine. The phenylenediamine can be employed in combination with a relatively small amount of other diamines such as diaminodiphenyl ether, 4,4'-diaminodiphenylpropane, 4,4'-diaminodiphenylethane, 4,4'-diaminodiphenylmethane, bis[4-(4-aminophenoxy)phenyl]propane, 2,2'-bis[4-(aminophenoxy)-phenyl]-1,1,1,3,3,3-hexafluoropropane, and bis[4-(4-aminophenoxy)phenyl] ether.

The aromatic polyimide film of the invention has a thickness in the range of 5 to 150 μm, preferably 5 to 100 μm, more preferably 5 to 75 μm, and most preferably 10 to 75 μm. An aromatic polyimide film having a thickness smaller than the lower limit has poor self-supporting strength. An aromatic polyimide film having a thickness larger than the upper limit is disadvantageous due to a high cost.

The aromatic polyimide film of the invention having one of the aforementioned glass transition temperature (Tg), heat shrinkage, and specific edge tearing resistance is advantageous because it shows a high dimensional stability, easy handling property, and good adhesion to an electroconductive film (e.g., copper foil).

The aromatic polyimide film of the invention can be prepared, for instance, by the following process.

The biphenyltetracarboxylic acid component and the phenylenediamine component are polymerized in a polar organic solvent (e.g., N,N-dimethylacetamide or N-methyl-2-pyrrolidone) at 10 to 80° C. for 1 to 30 hours, to give a solution of polyamide acid (polyamic acid, imidization ratio: less than 5%) having a viscosity (measured by a rotary viscometer, at 30° C.) of 500 to 4500 poise, in which the polymer concentration is in the range of 15 to 25 weight % and a logarithmic viscosity of polymer (measured at 30° C., concentration: 0.5 g/100 mL, solvent: N-methyl-2-pyrrolidone) in the range of 0.1 to 5.

To the resulting polyamide acid solution is preferably added 1,2-dimethylimidazole in an amount corresponding to 0.005–2 equivanlents, preferably 0.005–0.8 equivalent, more preferably 0.02–0.8 equivalent, per 1 equivalent of the amide acid unit of the polyamide acid. A portion of 1,2-dimethylimidazole can be replaced with imidazole, benzimidazole, N-methylimidazole, N-benzyl-2-methylimidazole, 2-methylimidazole, 2-ethyl-4-methylimidazole, 5-methylbenzimidazole, isoquinoline, 3,5-dimethylpyridine, 3,4-dimethylpyridine, 2,5-dimethylpyridine, 2,4-dimethylpyridine, or 4-n-propylpyridine.

To the polyamide acid solution can be also added a phosphorus compound in an amount of 0.01 to 5 weight parts, preferably 0.01 to 3 weight parts, more preferably 0.01 to 1 weight part, per 100 weight parts of the polyamide acid. The phosphorus compound can be an organic phosphorus compound (preferably, (poly)phosphoric acid ester, or an amine salt of phosphoric acid ester) or an inorganic phosphorus compound. Further, an inorganic filler can be added to the polyamide acid solution in an amount of 0.1 to 3 weight parts per 100 weight parts of the polyamide acid. Examples of the inorganic fillers include colloidal silica, silicon nitride, talc, titanium dioxide, and calcium phosphate. The inorganic filler preferably has an average particle size in the range of 0.005 to 5 μm, more preferably in the range of 0.005 to 2 μm. Thus, a polyimide precursor solution composition is made.

The polyimide precursor solution composition is continuously spread on a temporary substrate having a smooth surface such as a glass plate or a metal belt to form a continuous solution layer. The solution layer is dried at 100–200° C., for 1–30 minutes, to give a continuous solid film containing 30 to 50 weight % of volatile components (e.g., the employed solvent and water produced in the polymerization reaction) and having an imidization ratio of 5 to 80%.

The solid film is separated from the temporary support and optionally is further dried at 25–250° C., for 0.5–30 minutes. In the drying step, the solid film can be nipped at both side ends, optionally, under a certain tension, to stretch the film in the TD direction or both MD and TD directions.

The solid film can be dried after the film is coated or sprayed with a surface treating solution containing a coupling agent such as an aminosilane coupling agent, an epoxy silane coupling agent, or a titanate coupling agent. Examples of the coupling agents, preferably heat resistant coupling agents, include γ-aminopropyltriethoxysilane, N-β-(aminoethyl)-γ-aminopropyl-triethoxysilane, N-(aminocarbonyl)-γ-aminopropyl-triethoxysilane, N-[β-(phenoxyamino)-ethyl]-γ-aminopropyl-triethoxysilane, N-phenyl-γ-aminopropyltriethoxysilane, γ-phenylaminopropyltrimethoxysilane, β-(3,4-epoxycyclohexyl)-ethyl-trimethoxysilane, γ-glycidepropyl-trimethoxysilane, isopropyl-tricumylphenyl-titanate, and dicumylphenyl-oxyacetate-titanate. The surface treating solution can contain 0.5 to 50 weight % of the coupling agent in an organic solvent such as a lower alcohol or an amide solvent. The surface treatment can be conducted by coating uniformly the solution on the solid film by a known method such as gravure coating, silk screen or dipping, to form a thin film on the solid film.

The solid film is then heated to an elevated temperature, preferably, in a curing furnace, for drying and imidization to give an aromatic polyimide film of the invention. In more detail, the dried solid film is nipped at its both side ends and heated in a curing furnace at the highest temperature of 400 to 500° C. for 0.5 to 30 min, so as to give an imidized continuous film having a volatile component content of not more than 0.4 wt. %.

Thus produced aromatic polyimide film can be further treated on its one or both surfaces with an alkaline solution (for instance, by immersing the polyimide film in an alkaline solution such as a sodium hydroxide solution, washing the film successively with an acid and water, and drying the washed film), treated with the aforementioned surface treating solution (e.g., a solution of the coupling agent), and dried.

The continuous aromatic polyimide film is then wound up, preferably after heating the film to 200–400° C. under no tension or low tension for relaxation of stress.

An aromatic polyimide film having a thickness of more than 125 μm is favorably produced by simultaneously extruding two portions of the polyimide precursor solution composition one on another (that is, simultaneous co-extrusion) and drying and heating the double layer film in the aforementioned manner.

On one or both surfaces of the aromatic polyimide film of the invention can be coated a solution of a polyamide acid (which gives a polyimide having a glass transition temperature (Tg) of 180 to 260° C. to show adhesiveness at an elevated temperature) in a polar organic solvent (optionally, 1,2-dimethylimidazole or other auxiliary components can be incorporated). Otherwise, the polyamide acid solution is extruded simultaneously with the aforementioned polyamide acid solution for the preparation of the polyimide film having the improved physical properties to have a thin polyimide coating layer showing adhesiveness at an elevated temperature. The thin polyimide coating layer preferably has a thickness of 0.1 to 10 μm, more preferably 0.2 to 5 μm.

The thin polyimide coating layer preferably has a low modulus elasticity (specifically 1 to 250 kg/mm$^2$ at 25° C.) and can be produced using a polyamide acid prepared from a combination of an aromatic tetracarboxylic acid component and an aromatic diamine containing 3 or more benzene rings in its molecular structure, such as a combination of 2,3,3',4'-biphenyltetracarboxylic dianhydride and 1,3-bis(4-aminophenoxy)benzene (TPER). The thin polyimide coating layer preferably has a thickness of 0.1 to 25%, more preferably 0.5 to 10%, based on the thickness of the aromatic polyimide film of the invention.

Otherwise, a solution of an aluminum compound (e.g., aluminum-chelate compound such as, aluminum hydroxide or aluminum triacetylacetate), a tin compound (e.g., dibutyltin acetate, bis(tributyltin) oxide, or tetrabutyltin), a bismuth compound, or an antimony compound in an organic solvent such as an aliphatic or aromatic hydrocarbon solvent, an alcohol solvent, a ketone solvent, an ether solvent, or an amide solvent can be coated on the aromatic polyimide film of the invention. The metal atoms such as aluminum atom is preferably contained in the formed coating layer in an amount of 1 to 10,000 ppm, more preferably 1 to 1,000 ppm.

The aromatic polyimide film of the invention can be treated by corona discharge, plasma discharge (low temperature or atmospheric pressure), ultraviolet ray radiation, or flame treatment, optionally after applying the aforementioned surface treatment, and on thus treated polyimide film is provided an adhesive layer by coating an adhesive or laminating an adhesive film.

On the aromatic polyimide film of the invention can be deposited an electroconductive film by vacuum deposition, sputtering or plating. The electroconductive film can be laminated on the polyimide film using an adhesive. The adhesive can be a thermosetting or thermoplastic adhesive. Examples of the adhesives include thermosetting adhesives of epoxy resin, NBR-phenol resin, phenolbutyral resin, epoxy-NBR resin, epoxy-phenol resin, epoxy-polyamide resin, epoxy-polyester resin, epoxy-acrylic resin, acrylic resin, polyamide-epoxy-phenol resin, polyimide resin, polyimide-epoxy resin, and polyimidesiloxane -epoxy resin, and thermoplastic adhesives of polyamide resin, polyester resin, polyimide resin, and polyimidesiloxane resin. Preferred are a polyimide resin adhesive, a polyimide-epoxy resin adhesive, a polyimidesiloxane -epoxy resin adhesive, and an epoxy resin adhesive.

The electroconductive film employed in the invention preferably comprises a metal such as aluminum, copper, or copper alloy. Most preferred is copper foil. The copper foil can be an electrolytic (or electrolyzed) copper foil or a rolled (or calendered) copper foil. The copper foil preferably has a thickness of 8 to 50 μm and a tension strength of not less than 17 kg/mm$^2$. Preferably, a electrolyzed or rolled copper foil having a thickness of 8 to 40 μm and a smooth surface is employed in combination with an adhesive layer of polyimide adhesive or polyimide(siloxane)-epoxy resin adhesive having a thickness of 3 to 30 μm.

An electroconductive circuit can be formed on the aromatic polyimide film of the invention directly or after placing an electroconductive film via an adhesive layer. For instance, an electroconductive circuit can be formed by placing an electroconductive film on the aromatic polyimide film directly or via an adhesive layer to give an electroconductive substrate, printing an etching resist on the electroconductive surface to give a resist pattern corresponding the desired circuit pattern, and removing the resist in the exposed area by the use of a known etching solution. On thus formed circuit pattern can be covered with a coating material (in the form of a liquid) directly or after surface treatment using a silane coupling agent or the like.

The present invention is further described by the following examples. In the following examples, the physical properties of the polyimide film was determined by the following methods. The determination procedure was performed at 25° C., unless otherwise identified.

(1) Elongation: ASTM D882-83 (MD)
(2) Tensile modulus (of elasticity): ASTM D882-83 (MD)
(3) Tear resistance (Elmendorf): measured by a commercially available Elmendorf tearing tester according to ASTM D1922-67 (MD)
(4) Glass transition temperature (Tg): determined from tan δ and E' (dyne/cm$^2$) which are measured by a viscoelasticity analyzer (RSA2, manufactured by Leometric Corp.). A temperature at which E' decreases by approximately 2 figures corresponds to Tg.
(5) Tensile strength: ASTM D882-83 (MD)
(6) Heat shrinkage: JIS C2318 (at 200° C.)
(7) Dielectric breakdown voltage: JIS C2318
(8) Edge tearing resistance: JIS C2318 (MD) The edge tearing resistance (or specific edge tearing resistance) set forth in the below-described Table 1 means an average value measured on five samples according to JIS C2318.
(9) Linear expansion coefficient (50 to 200° C.): A sample is heated at 300° C. for 30 minutes for relaxation of stress and then measured by means of TMA apparatus (tensile mode, 2 g weight, sample length: 10 nm, 20° C./min.)
(10) Tear strength: A film is cut out to give a square sample (7.5 cm×7.5 cm). On one side, a notch of 5 cm long is formed. The sample is gripped on both sides over the notch and then stretched at a rate of 200 mm/min. The tear strength corresponds to a force (in term of weight (g)) at which the sample is torn.
(11) Flexing resistance (MIT): ASTM D2176 (MD)
(12) Adhesion strength: measured using a polyimide siloxane-epoxy resin adhesive [mixture of 100 weight parts of polyimidesiloxane (modulus elasticity: 75 kg/mm$^2$), 43 weight parts of epoxy resin (EP 807, available from Yuka-Shell Co., Ltd.), 33 weight parts of phenol-novolak resin (available from Meiwa Kasei Co., Ltd.) and 0.2 weight part of a curing catalyst]. An electrolytic copper foil of 18 μm thick (available from Fukuda Metal Co., Ltd.) and a polyimide film is combined using the adhesive and heated to 100–160° C. for curing at 160° C. for 4 hours. The cured sample is subjected to 180° peeling test at a rate of 50 mm/min.
(13) Tearing test of polyimide film-copper foil composite: The test sample prepared in the test of adhesion strength (13) is cut to give a square (7.5 cm×7.5 cm). On one side, a notch of 5 cm long is formed. Both sides over the notch are gripped by clips. One clip is fixed and another clip is equipped with a weight of 70 g. The composite sample is left under the conditions for 1 minute. Then, the sample is observed to check whether tearing occurs or not.

EXAMPLE 1

A solution of 5.897 weight parts of p-phenylenediamine and 16.019 weight parts of 3,3',4,4'-biphenyltetracarboxylic dianhydride in 100 weight parts of N,N-dimethylacetamide is stirred at 40° C. for 3 hours in a nitrogen gas stream, to give a polyamide acid solution having a polymer concentration of 18 weight % and a solution viscosity of 1,800 poise (measured at 30° C. using a rotary viscometer). The polyamide acid polymer showed a logarithmic viscosity of 1.3 (measured at 30° C., concentration: 0.5/100 mL, solvent: N,N-dimethylacetamide).

To 100 weight parts of the polyamide acid solution were added 0.1 weight part of an ethanolamine salt of monostearylphosphoric acid ester and 0.5 weight part (in terms of solid amount) of colloidal silica (mean diameter: 0.08 μm). The resulting mixture was stirred to give a polyamide acid solution composition. To 100 weight parts of the polyamide acid solution composition was further added 2.39 weight parts (0.1 equivalent per 1 equivalent of the amide acid unit) of 1,2-dimethylimidazole. The mixture was stirred at 40° C. for 2 hours to give a polyimide precursor solution composition.

The polyimide precursor solution composition was continuously extruded from a slit of T-die to form a thin solution film on a temporary metal support having a smooth surface. The thin solution film was heated at 140° C. for 20 minutes to give a self-supporting film and peeled off from the support. The peeled film was fixed on both sides and passed through a heating furnace. The highest temperature in the furnace was set to 480° C. The retention time in the furnace was 13 minutes.

Thus, a continuous aromatic polyimide film having a thickness of 50 μm was prepared.

EXAMPLE 2

The procedures of Example 1 were repeated except that the solution film was heated at the same temperature for 13 minutes and the retention time in the furnace was set to 8.6 minutes, to obtain a continuous aromatic polyimide film having a thickness of 50 μm according to the invention.

EXAMPLE 3

The procedures of Example 1 were repeated except that the solution film was heated at the same temperature for 10 minutes and the retention time in the furnace was set to 6.5 minutes, to obtain a continuous aromatic polyimide film having a thickness of 50 μm according to the invention.

COMPARISON EXAMPLE 1

The procedures of Example 1 were repeated except for using no 1,2-dimethylimidazole, to obtain a continuous aromatic polyimide film having a thickness of 50 μm for comparison.

Evaluation of Aromatic Polyimide Film

The aromatic polyimide films obtained in Examples 1 to 3 and Comparison Example 1 were measured in various physical properties according to the aforementioned test methods. The results are set forth in Table 1.

Separately, an electrolytic copper foil of 18 μm thick was placed on each aromatic polyimide film (on the B surface) via an epoxy resin adhesive (TE-5701, available from Toray Corporation, Ltd.). The resulting composite sheet was kept at 180° C. for 5 minutes to a united composite sheet. The united composite sheet was subjected to the aforementioned adhesion measuring test. The results are also set forth in Table 1.

TABLE 1

|  | Examples | | | Comparison Ex. |
| --- | --- | --- | --- | --- |
|  | 1 | 2 | 3 | 1 |
| Film thickness (μm) | 50 | 50 | 50 | 50 |
| Tensile modulus (kg/mm$^2$) | 780 | 790 | 810 | 850 |
| Elongation (%) | 60 | 56 | 54 | 43 |
| Tear resistance (g/mm, Elmendorf) | 830 | 820 | 760 | 510 |
| Tg (° C.) | >400 | >400 | >400 | >400 |
| Tensile strength (kg/mm$^2$) | 54 | 48 | 49 | 48 |
| Heat shrinkage (%) | 0.05 | 0.05 | 0.06 | 0.07 |

TABLE 1-continued

|  | Examples | | | Comparison Ex. |
| --- | --- | --- | --- | --- |
|  | 1 | 2 | 3 | 1 |
| Dielectric break-down voltage (kV) | 9.5 | 9.4 | 9.5 | 9.5 |
| Edge tearing resistance (kg/20 mm) | 82 | 82 | 83 | 66 |
| Specific edge tearing resistance (kg/20 mm/10 μm) | 16.4 | 16.4 | 16.6 | 13.2 |
| Linear expansion (x $10^{-5}$/° C.) | 1.3 | 1.3 | 1.1 | 1.4 |
| Tear strength (g) | 26 | 26 | 25 | 16 |
| Flexing resistance (x$10^4$, MIT) | >10 | >10 | >10 | 5.6 |
| Adhesion strength (kg/cm, B surface) | 1.4 | 1.4 | 1.3 | 1.5 |
| Tear strength of Composite sheet | not torn | not torn | not torn | torn |

Remark: ">" means "higher than" or "more than".

EXAMPLE 4

The procedures of Example 1 were repeated except for replacing a slit of the T-dye to obtain a continuous aromatic polyimide film having a thickness of 7.5 μm according to the invention.

The obtained polyimide film had the following physical properties: tensile modulus 1,000 kg/mm$^2$, elongation 60%, tear resistance (Elmendorf) 390 g/mm, Tg higher than 400° C., heat shrinkage 0.06%. All of the specific edge tearing resistance, dielectric breakdown voltage, linear expansion coefficient and tear strength and flexing resistance (MIT) were the same as or higher than those measured on the polyimide film of Example 1.

EXAMPLE 5

The procedures of Example 1 were repeated except that a solution of aluminum triacetyl triacetate in toluene (2 wt. %) was coated on the self-supporting film, to obtain a continuous aromatic polyimide film having a thickness of 50 μm according to the invention. The aluminum content in the film was 65 ppm.

The obtained polyimide film was measured in the various physical properties and confirmed that the physical properties were almost the same as those of the polyimide film of Example 1.

The obtained polyimide film was cut to give a sample of a holder size and placed in a vacuum deposition apparatus. Then, vacuum deposition was performed under the following conditions: substrate temperature: 150° C., pressure: less than 2x$10^{-4}$ Pa, purity of target copper: 4 N, deposition rate: 10 to 25 angstroms/sec, to form on the coated surface of the polyimide film a copper film having a thickness of 0.2 μm.

On the copper film was plated a copper layer having a thickness of 10 μm by electrolytic plating.

Thus obtained composite sheet was immersed in 2N hydrochloric acid for 5 minutes and then subjected to T-peeling test at 25° C. T-peel strength was 2.5 kg/cm.

EXAMPLE 6

The procedures of Example 1 were repeated except hat a solution of a separately prepared polyamide acid solution (solution viscosity: approximately 2,000 poise) as coated on the self-supporting film to form a thin layer of 0.4 μm thick.

The above-mentioned polyamide acid solution was prepared by reacting 1,3-bis(4-aminophenoxy)benzene and 2,3,3',4'-phenyltetracarboxylic dianhydride (molar ratio: 1:1) in N,N-dimethylacetamide at 25° C. for 5 hours under a nitrogen gas stream. Thus, a continuous aromatic polyimide film having a thickness of 50.4 μm according to the invention was obtained.

The obtained polyimide film was measured in the various physical properties and confirmed that the physical properties were almost the same as those of the polyimide film of Example 1.

On the coated surface of the obtained polyimide film was plated a copper layer in the manner as described in Example 5 to give a composite sheet. The composite sheet was immersed in 2N hydrochloric acid for 5 minutes and then subjected to T-peeling test at 25° C. T-peel strength was 2.0 kg/cm.

EXAMPLE 7

The procedures of Example 1 were repeated except for replacing a slit of the T-dye, to obtain a continuous aromatic polyimide film having a thickness of 75 μm according to the invention.

The obtained polyimide film had the following physical properties: tensile modulus 830 kg/mm$^2$, elongation 68%, tear resistance (Elmendorf) 830 g/mm, Tg higher than 400° C., heat shrinkage 0.05%. All of the specific edge tearing resistance, dielectric breakdown voltage, linear expansion coefficient and tear strength and flexing resistance (MIT) were the same as or higher than those measured on the polyimide film of Example 1.

EXAMPLE 8

The procedures of Example 1 were repeated except for replacing a slit of the T-dye, to obtain a continuous aromatic polyimide film having a thickness of 25 μm according to the invention.

The obtained polyimide film had the following physical properties: tensile modulus 950 kg/mm$^2$, elongation 60%, tear resistance (Elmendorf) 570 g/mm, Tg higher than 400° C., heat shrinkage 0.05%. All of the specific edge tearing resistance, dielectric breakdown voltage, linear expansion coefficient and tear strength and flexing resistance (MIT) were the same as or higher than those measured on the polyimide film of Example 1.

What is claimed is:

1. An aromatic polyimide film comprising a biphenyltetracarboxylic acid unit and a phenylenediamine unit, and having a thickness in the range of 5 to 150 μm and an elongation at break as defined in ASTM D-882-83 in the range of 45 to 90%, which has the following tensile modulus and a tear resistance measured by Elmendorf tearing testor:

a tensile modulus of 750 to 1,300 kg/mm$^2$ and a tear resistance of 350 to 1,500 g/mm in the case that the thickness is not less than 5 μm and less than 50 μm;

a tensile modulus of 650 to 1,200 kg/mm$^2$ and a tear resistance of 550 to 1,500 g/mm in the case that the thickness is not less than 50 μm and less than 100 μm; and a tensile modulus of 550 to 1,100 kg/mm$^2$ and a tear resistance of 550 to 1,500 g/mm in the case that the thickness is not less than 100 μm and not more than 150 μm.

2. The aromatic polyimide film of claim 1, wherein the polyimide film has a thickness of 5 to 100 μm and a glass transition temperature of higher than 400° C.

3. The aromatic polyimide film of claim 1, wherein the polyimide film has a heat shrinkage of 0.002 to 0.4% measured at 200° C.

4. The aromatic polyimide film of claim 1, wherein the polyimide film has a specific edge tearing resistance of 14 to 25 kg/20 mm/10 μm.

5. The aromatic polyimide film of claim 1, wherein the polyimide film further contains 0.1 to 5 wt. % of an inorganic filler.

6. The aromatic polyimide film of claim 1, wherein the polyimide film shows a dielectric breakdown voltage of not lower than 3 kV.

7. The aromatic polyimide film of claim 1, wherein the polyimide film has been prepared by casting a polyamide solution to give a solution film and heating the solution film.

8. The aromatic polyimide film of claim 1, wherein the polyimide film has been prepared from a polyamide acid which is produced by polymerization of 3,3',4,4'-biphenyltetracarboxylic dianhydride and p-phenylenediamine.

9. A method for preparing the aromatic polyimide film of claim 1, which comprises heating a film of a polyamide acid solution containing an inorganic powder, an imidazole compound and an organic or inorganic phosphorous compound, said polyamide acid having been produced by reaction of a biphenyltetracarboxylic acid, its dianhydride with a phenylene diamine.

10. A composite sheet comprising an electroconductive film and the aromatic polyimide film of claim 1 which are bonded to each other directly or via an adhesive layer.

11. The composite sheet of claim 10, wherein the electroconductive film and the aromatic polyimide film are bonded to each other via an adhesive layer comprising a thermoplastic or thermosetting adhesive.

12. The composite sheet of claim 11, wherein the adhesive layer comprises an adhesive selected from the group consisting of a polyimide adhesive, a polyimide-epoxy resin adhesive, a polyimidesiloxane-epoxy resin adhesive, and an epoxy resin adhesive.

* * * * *